United States Patent [19]
Ito et al.

[11] Patent Number: 5,394,008
[45] Date of Patent: Feb. 28, 1995

[54] SEMICONDUCTOR INTEGRATED CIRCUIT DEVICE

[75] Inventors: Yutaka Ito; Toshiyuki Sakuta, both of Ome; Takumi Nasu, Tsuchiura, all of Japan

[73] Assignees: Hitachi, Ltd., Tokyo, Japan; Texas Instruments Incorporated, Dallas, Tex.

[21] Appl. No.: 84,520

[22] Filed: Jun. 30, 1993

[30] Foreign Application Priority Data

Jun. 30, 1992 [JP] Japan .................................. 4-196604

[51] Int. Cl.⁶ ..................... H01L 23/48; H01L 29/44; H01L 25/52; H01L 29/60
[52] U.S. Cl. ..................... 257/666; 257/691; 257/676; 257/696
[58] Field of Search ............... 257/666, 676, 691, 692, 257/528, 536, 696

[56] References Cited

U.S. PATENT DOCUMENTS 5,200,364  4/1993  Loh ..................... 257/676
5,229,639  7/1993  Hansen et al. ..................... 257/666

FOREIGN PATENT DOCUMENTS 4-327264  11/1992  Japan .

Primary Examiner—Andrew J. James
Assistant Examiner—S. V. Clark
Attorney, Agent, or Firm—Antonelli, Terry, Stout & Kraus

[57] ABSTRACT

A semiconductor integrated circuit device with high power noise immunity and high substrate surge immunity. An LOC lead frame to be connected to a power wiring for supplying a source voltage and a ground potential to input circuits of a semiconductor chip is isolated from another LOC lead frame for supplying the source voltage and the ground potential to other circuits. The source voltage and the ground potential for the circuit are supplied by way of external terminals formed by the respective lead frames. Further, the isolated LOC lead frames are connected to each other through a resistive impedance component formed on the semiconductor chip.

30 Claims, 9 Drawing Sheets

SEMICONDUCTOR INTEGRATED CIRCUIT DEVICE

BACKGROUND OF THE INVENTION

The present invention relates to a semiconductor integrated circuit device, or more in particular to a technique effectively applied to a dynamic RAM (Random Access Memory) assembled on a lead-on chip (LOC) subjected to memory access by a plurality of bits each time, for example.

Examples of dynamic RAM assembled in LOC structure are disclosed in U.S. Ser. No. 07/424,904 filed Oct. 18, 1989 and U.S. Ser. No. 07/899,572 filed Jun. 18, 1992 corresponding to JP-A-3-214669 laid open Sep. 19, 1991. The dynamic RAM disclosed in the publication is fabricated by forming a pair of leads extending longitudinally at the central portion of a rectangular semiconductor chip for supplying a ground potential VSS and a source voltage VCC, which leads are wire-bonded with a plurality of grounding pads and power pads at a plurality of points. As a result, the use of a wiring material of low resistance value such as a lead frame provides the ground potential VSS and the source voltage VCC at a plurality of points, thereby reducing the power impedance of the circuit to minimum.

In the aforementioned method of supplying an operating voltage to a semiconductor chip by the use of the LOC structure, although the power impedance of the circuit is minimized, a comparatively large power noise generated by simultaneous operation of a multiplicity of output circuits with the increase in the number of bits for memory access is liable to be propagated to other circuits including input circuits. Especially, with the decrease in the operating voltage due to lower power consumption of semiconductor integrated circuit devices and the resulting tendency toward a smaller and smaller level margin for input circuits, the power noise generated by a multiplicity of outputs poses an important problem. In addition to this problem, it has been found that it is necessary to solve the problem of what is called electrostatic discharge (ESD) in which input circuit elements are destroyed by a substrate surge due to the power supply. See for example, "A New On-chip ESD Protection Circuit with Dual Parasitic SCR Structures for CMOS VLSI", IEEE Journal of Solid State Circuit, Vol. 27, No. 3, March 1992, pp. 274–280.

SUMMARY OF THE INVENTION

An object of the present invention is to provide a semiconductor integrated circuit device realizing a larger scale for the circuit and stabilization of operation.

Another object of the invention is to provide a large-scale semiconductor integrated circuit device driven by a low operating voltage, which is highly immune to power noise and to ESD.

Still another object of the invention is to provide a semiconductor integrated circuit device such as a dynamic RAM stable in operation which realizes both a large storage capacity and a multi-bit memory access at the same time.

In order to achieve the above-mentioned objects, according to one aspect of the invention, there is provided a semiconductor integrated circuit device, in which a lead frame to be connected to a power wiring for supplying a source voltage and a ground potential to input circuits formed on a semiconductor chip is isolated from another lead frame for supplying the source voltage and the ground potential to other circuits on the same semiconductor chip, so that the source voltage and the ground potential for the circuits are supplied through external terminals constructed by respective lead frames.

According to another aspect of the invention, there is provided a semiconductor integrated circuit device, in which in addition to the above-described structure for isolation of power supplies, the isolated lead frames are connected to each other through impedance means having a predetermined resistance value formed on the semiconductor chip to serve as a noise filter and a surge buffer.

The above-mentioned structure remarkably reduces the noise generated and propagated to the input side at the time of operation of the output while buffering a through-substrate surge due to the relatively large amount of supplied power. An operating margin of the input circuit can therefore be secured in the simultaneous output of a multiplicity of bits in a large-scale circuit.

DESCRIPTION OF THE EMBODIMENTS

Figure 7:
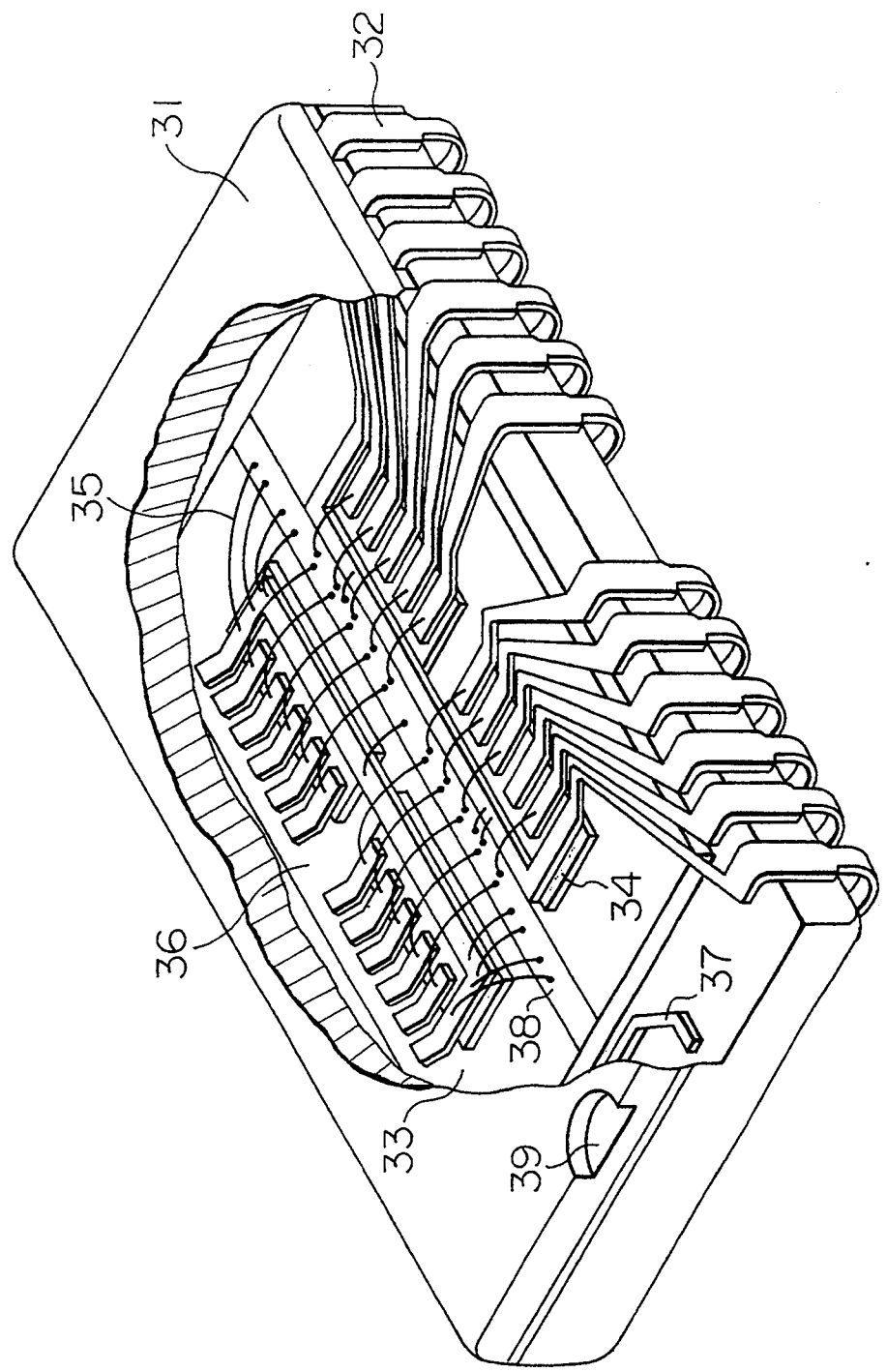
FIG. 7 is a perspective view showing a dynamic RAM of LOC structure according to an embodiment of the invention.

FIG. 7 shows a dynamic RAM of LOC structure according to an embodiment of the invention.

In FIG. 7, a reference numeral 31 designates a mold resin, numeral 32 external terminals (lead frames), and numeral 33 a semiconductor chip constituting a dynamic RAM. The semiconductor chip 33 is coupled to the lower side of the leads by a bonding agent through an insulating film 34. Internally, the forward end of each lead is connected to a bonding pad 38 of the semiconductor chip 33 by a gold wire (bonding wire) 35. Numeral 36 designates a bus bar lead for power supply extending in longitudinal direction at the central portion of the semiconductor chip. This bus bar lead is used for supplying a source voltage VCC and a ground potential VSS of the circuit. Peripheral circuits and input-/output circuits are arranged along a pair of bus bar leads, together with connecting pads. Numeral 37 designates a suspension lead, and numeral 39 an index.

The lead frames 32 may be partially covered except for the lead surfaces for connecting by bonding with the mold resin and thus may be connected to the surface of the semiconductor chip 33 by a bonding agent. In the case where such a lead frame of LOC structure is used, the lead frame may be arranged on the chip surface to provide a part of the semiconductor chip wiring, and the bonding pads of the circuit, if placed at the central portion of the chip, can be connected to the leads without any problem. Also, a bus bar lead structure so as to extend a power supply lead longitudinally of the chip minimizes the power impedance.

Figure 1A:
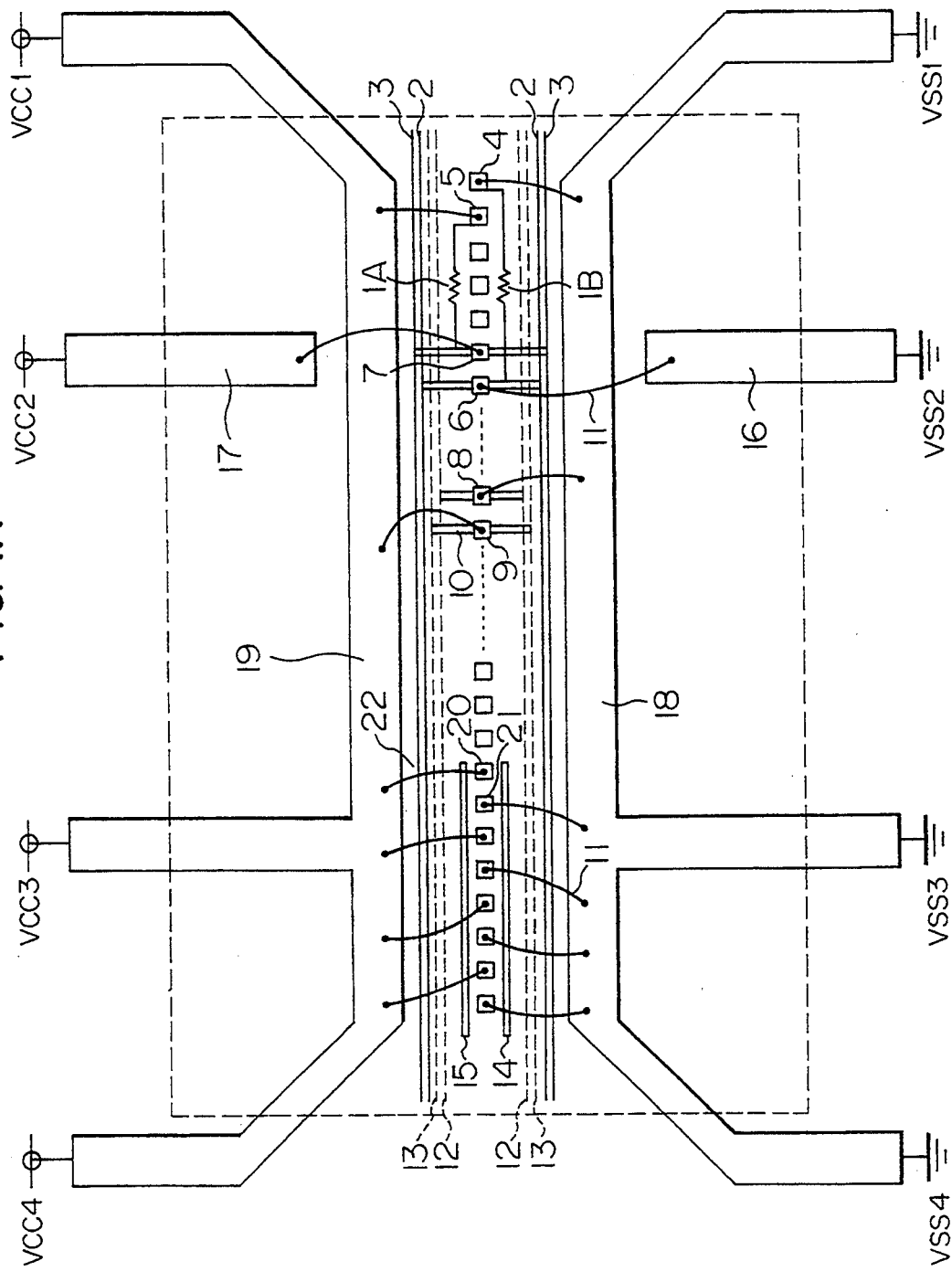
FIG. 1A is a plan view schematically showing a method of supplying power in a semiconductor integrated circuit device according to an embodiment of the invention.

FIG. 1A schematically shows a power supply configuration in a semiconductor integrated circuit device according to an embodiment of the invention. In FIG. 1A, the central portion of a semiconductor chip and lead frames for supplying power are illustrated as a representative case. The semiconductor chip is formed as a rectangle and has a pair of lead frames 18, 19 extending along the longitudinal direction of the central portion.

The lead frame 18 is a bus bar lead for supplying the ground potential VSS of the circuit, and the lead frame 19 a bus lead for supplying the source voltage VCC (or VDD). The dynamic RAM according to this embodiment is subjected to memory access by 16 bits each time. In order to meet this multiple-bit memory access, the bus bar lead 18, though not specifically limited, extends outward at three points including the upper and lower ends and the lower intermediate point and has outer ends thereof forming external terminals VSS1, VSS3 and VSS4, respectively. In similar fashion, the bus bar lead 19, though not specifically limited, extends outward at three points including the upper and lower ends and the lower intermediate point, and has the outer ends thereof making up external terminals VCC1, VCC3 and VCC4, respectively.

The bus bar leads 18, 19 are connected to a ground line 14 and a power line 15 for an output buffer in an output buffer area 22 of the semiconductor chip by means of bonding pads 21, 20 at a plurality of points. Similarly, the bus bar leads 18, 19 are connected to the bonding pads 8, 9 on a ground line 12 and a power line 13 for the internal circuit indicated by dotted line by means of bonding wires 10. The ground line 12 and the power line 13 are provided in two pairs along the longitudinal direction of the central portion of the semiconductor chip. Although only one bonding pad for the internal circuit is shown as a representative, a plurality of bonding pads are arranged at several points of the longitudinal intermediate portion in order to reduce the power impedance, and connected to the bus bar leads by the bonding wire at each point of the bonding pads.

According to the embodiment under consideration, in order to prevent the noise due to the multi-bit output at a 16-bit output buffer (output circuit) from being applied through the bus bar leads 18, 19 to the input circuit, i.e., in order to secure a level margin of the input circuit, leads 16, 17 isolated from the bus bar leads 18, 19 are provided as power leads for the input circuit. The lead 16 is disposed at a point corresponding to the upper intermediate portion of the bus bar lead 18, and is constructed integrally with the external terminal VSS2. The lead 17, which is arranged at a point corresponding to the upper intermediate portion of the bus bar lead 19, is constructed integrally with the external terminal VCC2.

A pair of ground lines 2 and a pair of power lines 3 for the input circuit are provided longitudinally outside of the right-hand and left-hand sides of the central portion of the chip. The bonding pad 6 connected to the ground line 2 is connected to a grounding lead 16 through a bonding wire 11. A bonding pad 7 connected to the power line 3 is also connected to the lead 17 through the bonding wire 11.

According to this embodiment, the operation of a dynamic RAM is made possible by supplying the ground potential and the source voltage to any of the four power terminals VSS1 to VSS4 or VCC1 to VCC4. In order to prevent the noise generated in the output circuit from adversely affecting the level margin of the input circuit, on the other hand, an impedance component 1 including mainly a resistance component and secondarily a capacitance component and an inductance component is formed on the semiconductor chip. The impedance component has an end thereof connected directly to the ground line 6 and the power line 7 for the input circuit, and has the other end thereof formed with the bonding pads 4 and 5. These bonding pads 4 and 5 are connected to the bus bar leads 18 and 19, respectively by bonding wire.

In this configuration, the power supply lines 2 and 3 for the input circuit are connected to the bus bar leads 18 and 19 which are in turn connected to the power supply lines 12, 13 and the power supply lines 14, 15 through the impedance component 1 and the bonding wire. The insertion of the resistor suppresses the fluctuations in potential at the power pins in DC fashion, while at the same time preventing the noises generated in a peripheral circuit such as the output circuit from entering the input circuit. The impedance component 1 preferably has a resistance value of about 10 Ω to 100 Ω and is formed by the use of a wiring material such as aluminum in the uppermost layer of the semiconductor chip.

The importance of the impedance means 1 connected between the isolated power leads will be explained with reference to FIGS. 1B and 1C.

The behavior of the current in the semiconductor substrate as examined by an ESD test conducted between the power pins on the input and output sides of the semiconductor chip will be described with reference to a model sectional view of the semiconductor chip shown in FIG. 1B. In FIG. 1B, a p-well 41 and n-wells 42, 43 are formed in a p-type substrate 40, for example. These wells are formed with MOS transistors 44 to 47 as shown. The source or drain of each of the MOS transistors is connected to the power pads 4 to 7 through internal multilayer wirings 48, 49 made of a refractory metal such as tungsten. As described above, the power pads 4, 5 are for supplying power to the output circuit (peripheral circuit), and the power pads 6, 7 for supplying power to the input circuit (input buffer). An ESD test conducted in the absence of the impedance components 1A, 1B containing essentially resistance components, respectively, connected between the isolated power lines shows that the tendency of a surge current 50 to flow from the power line for the peripheral circuit through the substrate by way of MOS transistors (e.g., 44, 45) breaks down the MOS transistors (devices) in which the surge flows. The reason is that the power wiring metal formed on the substrate is completely isolated between wirings 5 and 6.

In view of this, the present inventors conceived an idea of forming impedance means for providing a relief or buffering path for the surge current on a power wiring metal layer on the substrate surface to prevent the device from being broken down. The resistance component and the reactance component impedance means are, considered to contribute to high immunity to the ESD in the device, and the resistance component and the capacitance component to contribute to high noise immunity. Specifically, resistance components 1A and 1B as impedance means are inserted between the isolated power/ground wirings 4 and 6 and between the wirings 5 and 6 supplied by the isolated leads respectively, whereby the surge current flows through the connected resistance components 1A, 1B but not through the substrate as indicated by a route 51.

Figure 1B:
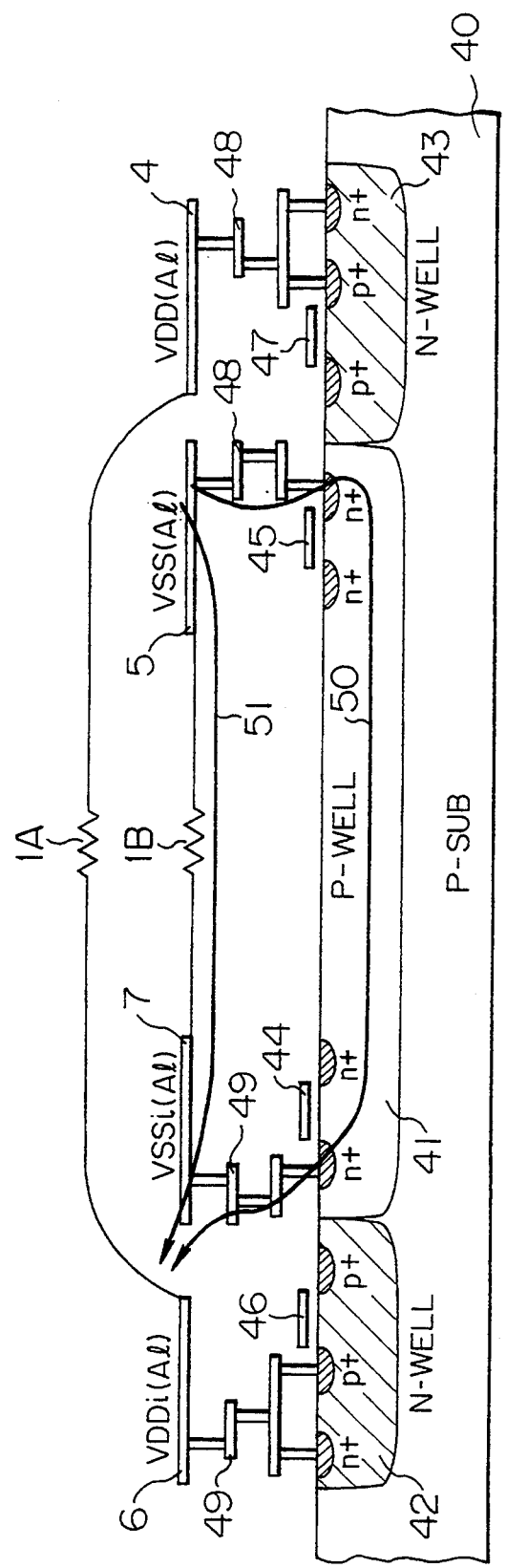
FIG. 1B is a partial sectional view of a semiconductor chip for explaining the installation of impedance means having the functions of a noise filter and a surge current buffer at the same time.
Figure 1C:
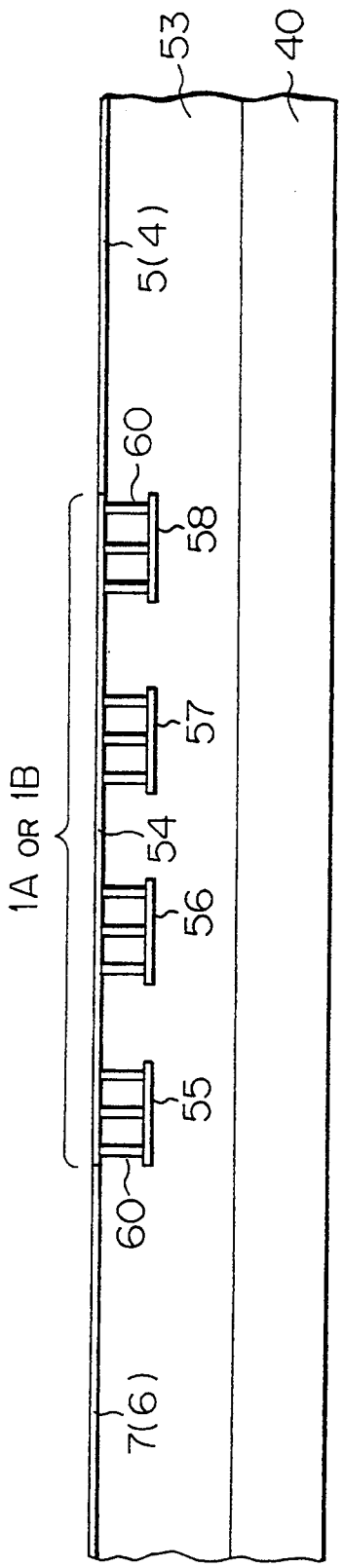
FIG. 1C is a partial sectional view of a semiconductor chip showing a example of configuration of the impedance means shown in FIG. 1B.

FIG. 1C is a partial sectional view of a semiconductor chip showing an example of construction of the resistive impedance means of FIG. 1B. In FIG. 1C, only one of the power lines VDD and VSS is shown for simplicity, and both have the same configuration. The power wiring metal pattern on the insulating layer 53 (of e.g., SiO2) on the substrate includes a power supply (5 or 4) for the peripheral circuit and a power supply (7 or 6) for the input buffer physically isolated from each other, and the metal is composed of an Al thin film at least 30 μm in width. Resistive impedance components (1A, 1B) in a multilayer of an Al layer and a refractory metal layer such as tungsten with a predetermined length are interposed between the isolated power wiring metal patterns. The upper layer 54 is an Al thin film about 10 μm in width integrally formed with the isolated power metal pattern. The lower layers 55 to 58 are a multilayer of refractory metal like tungsten connected by way of thru-holes or vias 60. This multilayered impedance components (1A, 1B) are preferably set to a resistance value in the range of about 10 to 100 Ω, and function as a noise filter and a surge current buffer. The wiring (Al) for signal lines connecting the elements of an integrated circuit to each other has a width of about 2 μm. It will be understood to those skilled in the art that instead of Al or tungsten, other materials with similar properties and functions may be used as wiring materials with equal effect.

In view of the requirement to prevent the noise generated at a peripheral circuit from entering the input circuit side, the resistance elements 1A, 1B may be omitted. Instead, with the leads isolated for supplying power to the input circuit as described above, power is also supplied to the power leads for the input circuit on a substrate.

Figure 2:
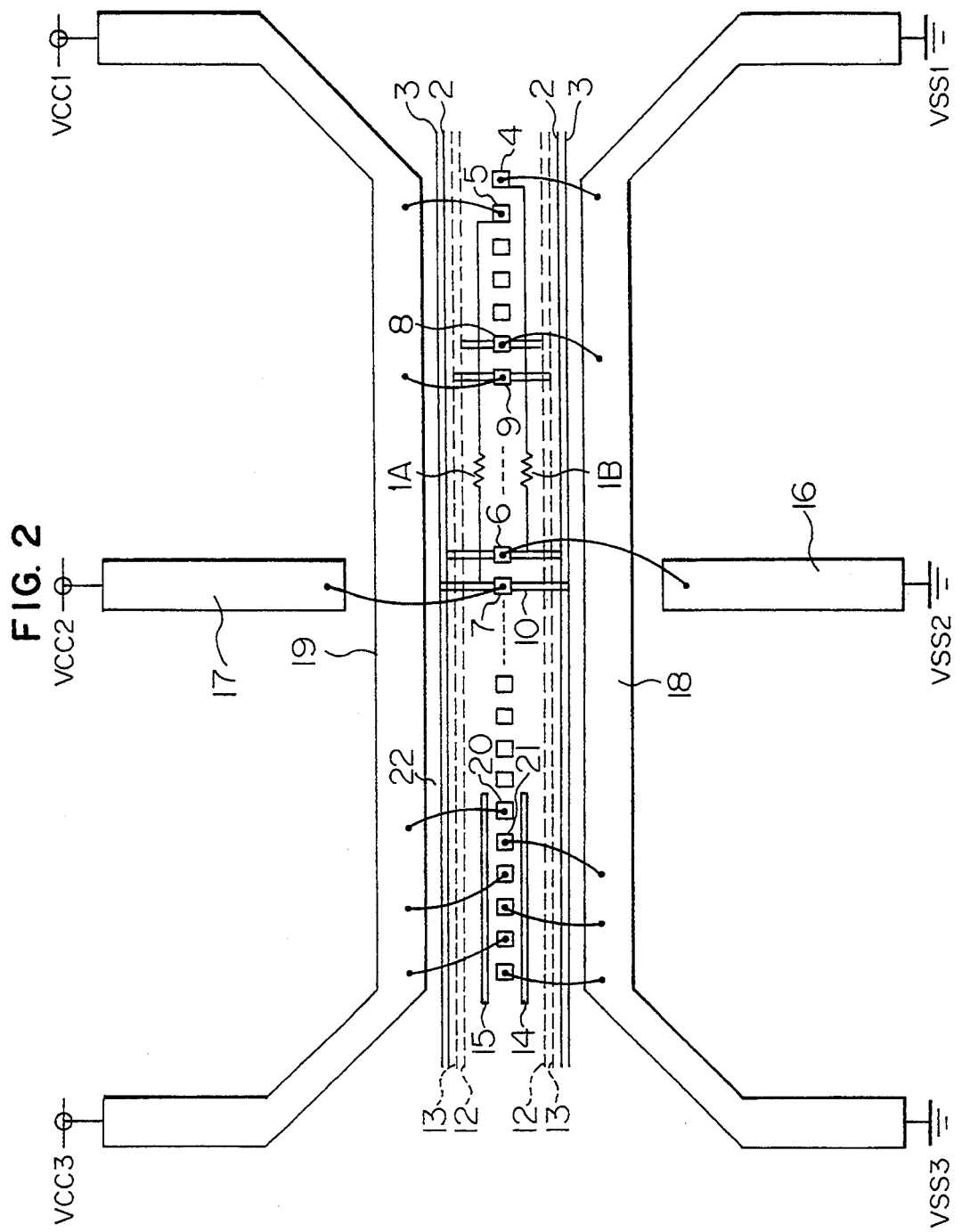
FIG. 2 is a plan view schematically showing a method of supplying power in a semiconductor integrated circuit device according to another embodiment of the invention.

FIG. 2 schematically shows a power supply configuration in a semiconductor integrated circuit device according to another embodiment of the invention. In FIG. 2, the central portion of a semiconductor chip and lead frames for supplying power to the central portion are illustrated while the whole view of the semiconductor and other signal leads are omitted.

The lead frame 18 is a bus bar lead for supplying the ground potential VSS for the circuit, and the lead frame 19 is one for supplying the source voltage VSS (or VDD). The dynamic RAM according to the present embodiment is subjected to memory access by 8 bits each time. With the decrease in the number of bits accessed this way, the bus bar lead 18, though not specially limited, is extended outward at the vertical ends to form external terminals VSS1 and VSS3. In similar fashion, the bus bar lead 19, though not specifically limited, is extended outward at the two vertical ends and becomes external terminals VCC1 and VCC3.

The bus bar leads 18, 19, as in FIG. 1A, are connected with the power supply lines 14, 15 for the output circuit, and the power supply lines 12, 13 for the internal circuit are connected by a bonding wire through the bonding pads 21, 20 and 8, 9 provided at a plurality of different points.

According to the embodiment under consideration, in order to secure a level margin of the input circuit, leads 16, 17 isolated from the bus bar leads 18, 19 are arranged at the intermediate portion to constitute external terminals VSS2 and VCC2. The bonding pad 6 connected to the ground line for the input circuit is connected to the lead 16 for grounding through the bonding wire. The bonding pad 7 connected to the power line 3 is connected to the power lead 17 through the bonding wire.

In order to suppress variations in potential at the power pins in DC fashion, a comparatively long internal wiring is formed from the central portion containing the bonding pads 6, 7 toward the bonding pads 4, 5 at the upper end of the chip. These are used as impedance components (resistance) 1A, 1B. The bonding pads 4, 5 are connected to the bus bar leads 18 and 19, respectively by means of the bonding wire.

Also in this configuration, the power supply lines 2, 3 for the input circuit are connected to the bus bar leads 18, 19 connected with the power supply lines 12, 13 for the internal circuit through the resistance elements 1A, 1B and the bonding wire. The resistance elements thus inserted suppress the potential fluctuations at the power pins in DC fashion while at the same time preventing the noise generated in the output circuit from entering the input circuit.

Figure 3:
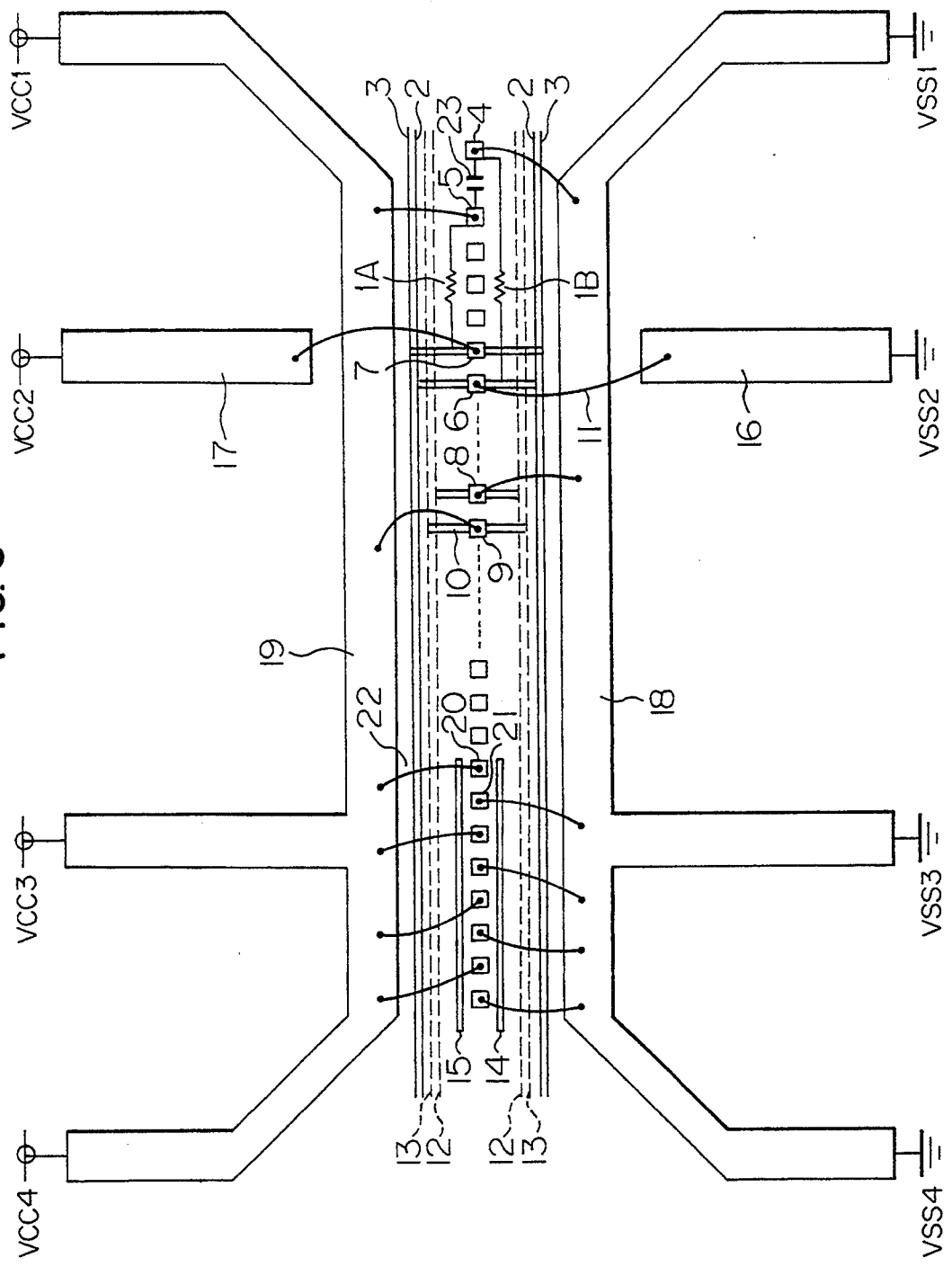
FIG. 3 is a plan view schematically showing a method of supplying power in a semiconductor integrated circuit device according to still another embodiment of the invention.

FIG. 3 schematically shows a power supply configuration for a semiconductor integrated circuit device according to another embodiment of the invention. In FIG. 3, the central portion of a semiconductor chip and lead frames for supplying power to the semiconductor chip are illustrated as a typical example. The whole structure of the semiconductor chip and the other signal leads are not shown.

The embodiment shown in FIG.3 is a modification of the embodiment shown in FIG. 1A, and includes a capacitor 23 inserted between the bonding pads 4 and 5 at the other end of the resistive elements 1A, 1B. This capacitor 23, which makes up a low-pass filter with the resistive elements 1A, 1B, is for efficiently absorbing comparatively large noise generated in the lead frames 18, when a 16-bit output signal is sent out. The capacitor 23 can be formed from a conductor layer under a metal layer and an insulating film making up an upper layer connected to the bonding pad 4 or 5 on a semiconductor chip. The configuration of the other parts is similar to FIG. 1A and is omitted.

Figure 4:
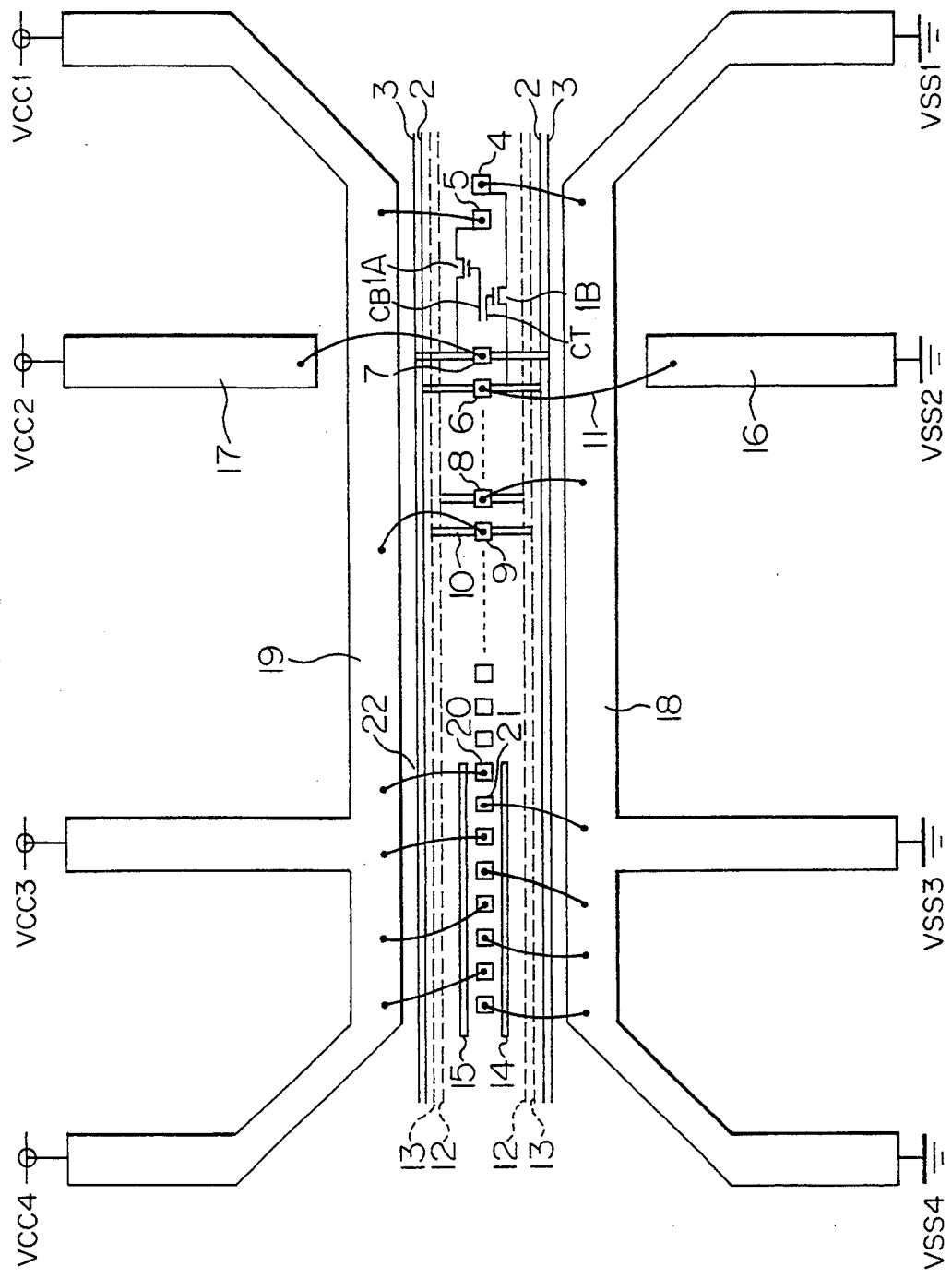
FIG. 4 is a plan view schematically showing a method of supplying power in a semiconductor integrated circuit device according to a further embodiment of the invention.

FIG. 4 schematically shows a power supply configuration in a semiconductor integrated circuit device according to another embodiment of the invention. In FIG. 4, the central portion of a semiconductor chip and lead frames for supplying power to the central portion are illustratively shown as a typical example and the whole configuration of the semiconductor chip and other signal leads are not shown.

The embodiment shown in FIG. 4 is a modification from that shown in FIG. 1A, and includes MOSFETs 1A, 1B in place of the resistive elements. Specifically, a p-channel MOSFET is interposed between a bonding pad 5 and a bonding pad 7 corresponding to a source voltage VCC2, and an n-channel MOSFET between a bonding pad 4 and a bonding pad 6 corresponding to the ground potential VSS2. These MOSFETs are subjected to switching control by control signals CB and CT.

The control signal CB becomes high to turn off the p-channel MOSFET when the output circuit begins to operate, while the control signal CT becomes low to turn off the n-channel MOSFET when the output circuit begins to operate. As a result, noise generated in initial stages of operation of the output circuit is prevented from being transmitted to the source voltages VCC2 and VSS2 of the input circuit. In addition, when the signal CB becomes low and CT high, the p-channel MOSFET and the n-channel MOSFET are turned on to function as resistive elements, thereby suppressing DC fluctuations between power pins. The signals CB and CT, though not specifically limited, are formed on the basis of an output control signal of the output circuit of the dynamic RAM. The remaining parts of the configuration are similar to those of FIG. 1A and will not be described.

Figure 5:
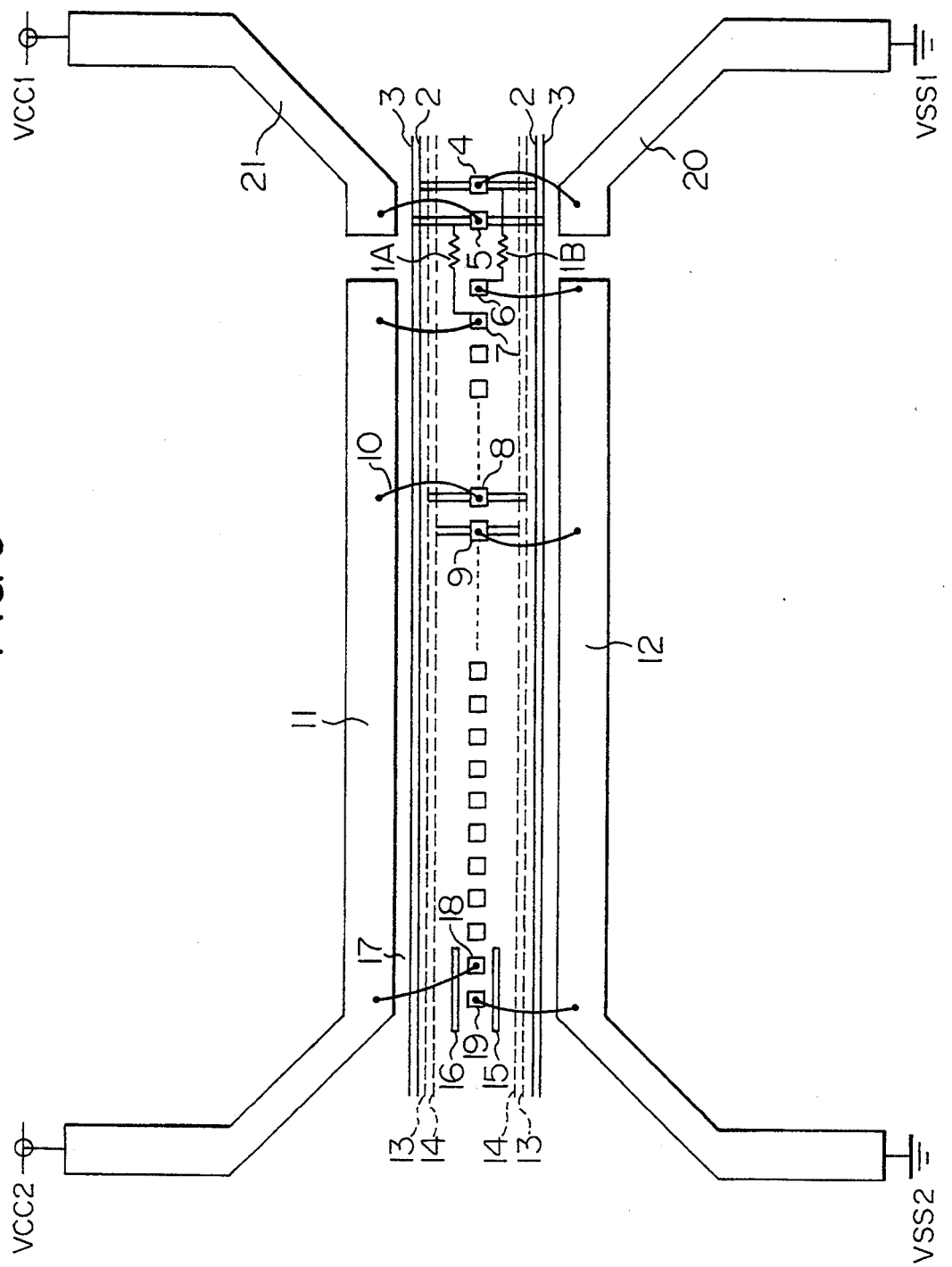
FIG. 5 is a plan view schematically showing a method of supplying power in a semiconductor integrated circuit device according to a still further embodiment of the invention.

FIG. 5 schematically shows a power supply configuration in a semiconductor integrated circuit device according to another embodiment of the invention. In FIG. 5, the central portion of a semiconductor chip and lead frames for supplying power to the central portion are illustratively shown as a typical example. The whole structure of the semiconductor chip and the other signal leads are not shown.

Lead frames 12, 20 are bus bar leads for supplying a ground potential VSS for the circuit, and lead frames 11, 21 bus bar leads for supplying a source voltage VCC (or VDD). The dynamic RAM according to this embodiment is subjected to memory access by 4 or 1 bit each time. With the decrease in the number of bits accessed, the bus bar leads 12, 20 (the bus bar leads 11, 21) are isolated from each other at the upper ends as described above. The shorter part 20 is used as an external terminal VSS1, and the lower longer part 12 as an external terminal VSS2. In similar fashion, the shorter part 21 separated at the upper end assumes an external terminal VCC1, and the lower longer one 11 an external terminal VCC2.

The longer bus bar leads 12, 11 form an output buffer area 17 underside, and are connected by bonding wire to bonding pads 19, 18 arranged in the buffer area 17. In similar manner, the longer bus bar leads 12, 11 are connected by bonding wire to power supply lines 14, 13 for the internal circuit through bonding pads 9, 8.

The shorter bus bar leads 20, 21, on the other hand, are connected by bonding wire to bonding pads 4, 5 corresponding to power supply lines 2, 3 for the input circuit. These bonding pads 4, 5 connected with an end of resistive elements 1A, 1B, the other end of which is connected to bonding pads 6, 7. These bonding pads 6, 7, as in the aforementioned cases, are connected to the longer bus bar leads 12, 11 by bonding wire.

Also in this configuration, as in the above-mentioned cases, the power supply lines 2, 3 for the input circuit are connected the bus bar leads 12, 11 which in turn are connected with the power supply lines 13, 14 for the internal circuit and the power supply lines 15, 16 of the output circuit through the resistive elements 1A, 1B and the bonding wires. The insertion of these resistive elements or impedance elements suppresses the potential fluctuations at power pins in DC fashion, while at the same time preventing the noise generated at the output circuit from entering the input circuits.

Figure 6:
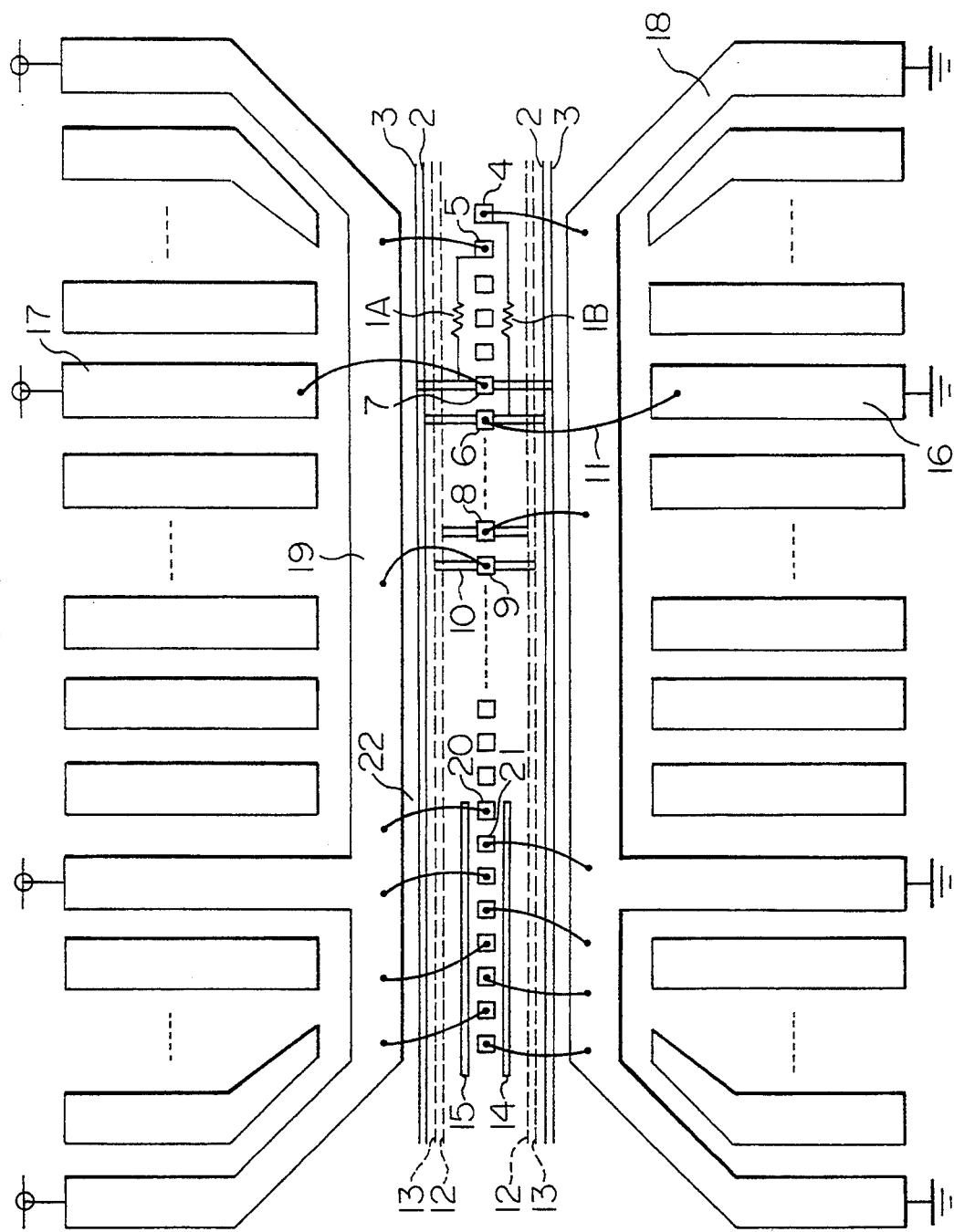
FIG. 6 is a plan view schematically showing a method of supplying power in a semiconductor integrated circuit device according to still another embodiment of the invention.

FIG. 6 schematically shows a power supply configuration in a semiconductor integrated circuit device according to an embodiment of the invention. In FIG. 6, the central portion of a semiconductor chip and lead frames for supplying power to the central portion are illustrated together with other signal leads. FIG. 6 shows an embodiment with signal leads added to the embodiment shown in FIG. 1A.

The signal leads corresponding to the output buffer area 22 are used as an output terminal. In the case where an external terminal is shared by input and output for reducing the number of external terminals, a buffer for data input is arranged also in the neighborhood of the output buffer. Also, a multiplicity of input signal leads are formed for address strobe signals RAS, CAS for multiplexing and introducing an address signal, control signals such as a write enable signal WE and an output enable signal OE and address signals distributed over the entire semiconductor chip. The power supply lines 2, 3 are arranged in a pair for each of the right and left sides in accordance with the distribution of signal leads. The relationship between the signal leads and the semiconductor chip is expressed clearly in FIG. 7.

Figure 8:
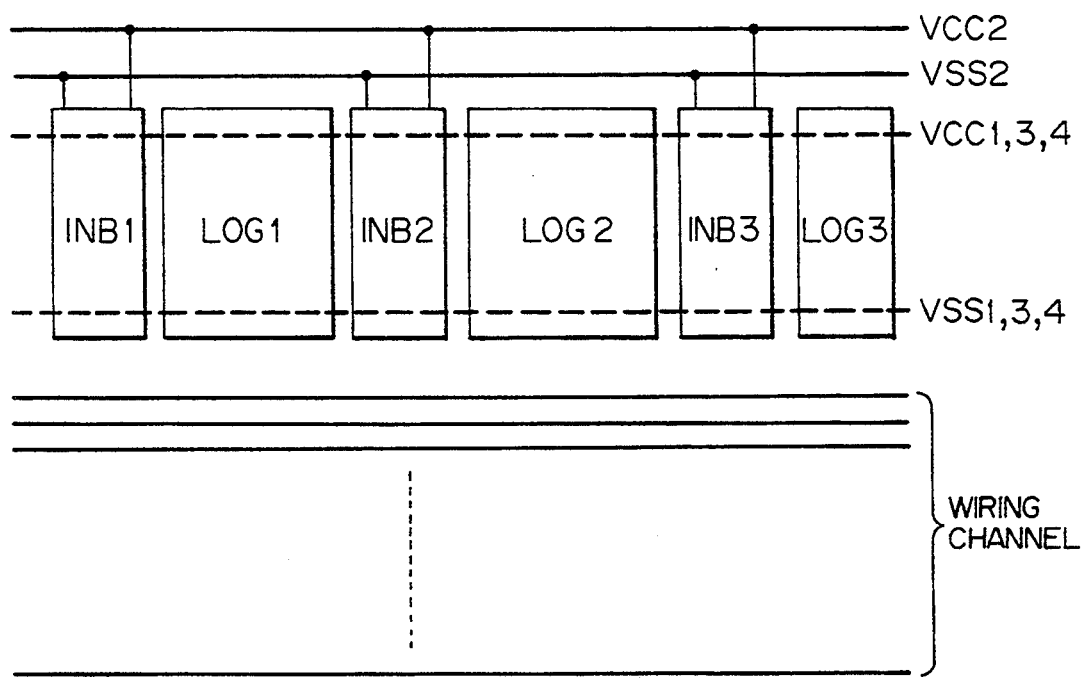
FIG. 8 is a schematic layout of an embodiment for explaining the relationship between power supply lines and input circuits and internal circuits.

FIG. 8 shows a schematic layout of an embodiment for explaining the relationship between each of the power supply lines and the input circuits and the internal circuits. Power supply lines VCC2 and VSS2 for input circuits INB1 to INB3 are arranged in parallel outside the central portion of the semiconductor chip. The power supply lines VCC2 and VSS2 correspond to the power supply lines 3, 2 in the embodiment of FIG. 1, for example.

Power supply lines VCC1, 3, 4 and VSS1, 3, 4 for internal logic circuits LOG1 to LOG3 indicated by dotted line are arranged in parallel inside the pair of the power supply lines VCC2, VSS2 for the input circuits. The power supply lines VCC1, 3, 4 and VSS1, 3, 4 are arranged in spaced relationship to each other with the input circuits INB1 to INB3 and the internal logic circuits LOG1 to LOG3 interposed therebetween.

The central portion of the semiconductor chip includes wiring channels for signal transmission between the internal circuits LOG1 to LOG3. Though not specifically limited, a line or two of bonding pads are arranged in staggered fashion or otherwise at the central portion of the semiconductor chip. The power supply lines for the output buffer are formed separately from the power supply lines VCC1, 3, 4 and VSS1, 3, 4 for the internal logic circuits as in the embodiment of FIG. 1.

An output signal of a comparatively large signal amplitude is formed in the internal logic circuits LOG1 to LOG3. These signals are transmitted through the wiring channels. In this way, the wiring channels for transmitting signals of large amplitude are formed and isolated from the power supply lines VCC2, VSS2 for the input circuit by the area formed with the input circuits INB1 to INB3 and the internal logic circuits LOG1 to LOG3 and the power supply lines VCC1, 3, 4 and VSS1, 3, 4 for the internal circuits. Therefore, the coupling noise caused by signal change is prevented from riding on the power supply lines VCC2, VSS2 for the input circuits. As a result, the reduction in the operating margin for the input circuits due to the power fluctuations which otherwise might be caused by signal coupling is prevented.

The power supply lines VCC2, VSS2 for the input circuits described above are arranged in parallel over a relatively long distance in proximity to the sides of the central portion of a long narrow semiconductor chip. Consequently, the power supply lines VCC2, VSS2 have a comparatively large parasitic capacitance. This parasitic capacitance makes up a low-pass filter with the resistive elements 1A, 1B for preventing noises, thus contributing to stabilization of the source voltage VCC2 for the input circuits and the ground potential VSS2 of the circuit. The layout of power supply lines as shown in this embodiment makes it possible to prevent the noise generated during the operation of the output circuits from entering the input circuits effectively without any capacitor unlike in the embodiment of FIG. 3.

The following advantages are obtained from the embodiments described above but, the present invention should be understood not to be limited to these advantages:

(1) The LOC lead frame to be connected to the power wiring for supplying a source voltage and a ground potential to the input circuits is isolated from the LOC lead frame for supplying the source voltage and the ground potential to other circuits. The source voltage and the ground potential for the circuit are supplied by way of external terminals made up of the respective lead frames, or the LOC lead frames are connected to each other through impedance means formed on a semiconductor chip, thereby remarkably reducing the noise generated and propagated to the input circuits during the operation of the output circuits. With the increase in the size of the circuit, therefore, a multiplicity of bits are outputted simultaneously while at the same time securing an operating margin for the input circuits.

(2) A capacitor is inserted between power wirings for supplying the source voltage and the ground potential for the input circuits or in a wiring route for supplying the source voltage and the ground potential to other output circuits and internal circuits, so that the noise generated during the operation of the output circuits can be effectively absorbed by the impedance means, thereby increasing the operating margin for the input circuits.

(3) It is not necessary to make the rise and fall of the output signal less steep at the output circuits in view of the fact that the noise generation is reduced considering the operating margin of the input circuits due to the advantages (1) and (2) above. A high-speed operation is thus realized.

The invention made by the present inventor has been explained above specifically with reference to embodiments. The present invention is not limited to the above-mentioned embodiments and may of course be modified in various ways without departing from the spirit of the invention. In the embodiment shown in FIG. 1, for example, the memory may be accessed by 8 bits each time or by a multiplicity of bits, say, 32 bits. In this way, the number of output bits and the configuration of the LOC lead frames connected to the power wiring may be variously modified.

To more secure high noise immunity on power lines in the present circuit device power-line shield techniques disclosed in a Japanese Patent Application No. Hei 4-327264 in the name of the present inventors are applicable, the disclosure of which is incorporated herein by reference.

The present invention is applicable to a wide variety of devices including various types of memory such as the dynamic RAM and static RAM and various digital integrated circuits such as mircroprocessors and other large-scale semiconductor integrated circuit devices.

What is claimed is:

1. A device comprising:
   a semiconductor chip;
   a first lead frame to be connected to a power supply wiring for supplying a source voltage or a ground potential to an input circuit formed in said semiconductor chip; and
   a second lead frame isolated from said first lead frame for supplying a source voltage or a ground potential to circuits formed in said semiconductor chip other than the input circuit,
   wherein each of said first and second lead frames includes an external terminal for supplying the source voltage or the ground potential to said input circuit and said other circuits;
   impedance means formed on said semiconductor chip for connecting said first and second lead frames to each other and providing a noise filter and a surge buffer;
   wherein said impedance means includes a power wiring conductor for said input circuit and a metal wiring formed integrally with the power wiring conductor for said other circuits.

2. A device comprising:
   a semiconductor chip;
   a first lead frame to be connected to a power supply wiring for supplying a source voltage or a ground potential to an input circuit formed in said semiconductor chip; and
   a second lead frame isolated from said first lead frame for supplying a source voltage or a ground potential to circuits formed in said semiconductor chip other than the input circuit,
   wherein each of said first and second lead frames includes an external terminal for supplying the source voltage or the ground potential to said input circuit and said other circuits;
   impedance means formed on said semiconductor chip for connecting said first and second lead frames to each other and providing a noise filter and a surge buffer;
   wherein said impedance means includes a plurality of metal wiring layers, and
   each of said metal wiring layers includes a low-resistance metal conductor upper layer formed contiguously with a power wiring conductor for the input circuit and a power wiring conductor for said other circuits, and a lower layer providing a refractory metal conductor connected to said upper layer by a plurality of through-holes or vias.

3. A device according to claim 2, wherein said upper layer conductor is made of aluminum and said lower layer conductor of tungsten.

4. A device according to claim 1, wherein said power wiring conductor and said metal wiring conductor constituting said impedance means are formed of the same material in the same thickness, and the line width of the conductor constituting said impedance means is not more than one third of the width of said power wiring conductor.

5. A device according to claim 4, wherein the material of said conductor is aluminum.

6. A semiconductor integrated circuit device comprising:
a first LOC lead frame to be connected to a power wiring for supplying a source voltage or a ground potential to an input circuit formed in a semiconductor chip;
a second LOC lead frame isolated from said first LOC lead frame for supplying a source voltage or a ground potential to circuits formed in said semiconductor chip other than said input circuit; and
resistance means formed on said semiconductor chip for resistively connecting said first and second LOC lead frames to each other;
further comprising a capacitor interposed between the power wirings for supplying the source voltage and the ground potential for the input circuit;
wherein said capacitor is a parasitic capacitor structured such that the source voltage line for the input circuit and the ground line for the circuit are arranged adjacently to each other on said semiconductor chip.

7. A semiconductor integrated circuit device according to claim 6, which is a dynamic RAM for performing the write/read operations by a plurality of bits at a time.

8. A semiconductor integrated device, comprising:
a semiconductor chip;
a first lead to be connected to a first wiring for supplying a first potential to an input circuit formed in said semiconductor chip;
a second lead to be connected to a second wiring for supplying said first potential to circuits formed in said semiconductor chip other than the input circuit, wherein said second lead is physically isolated from said first lead;
a first connecting means electrically connecting said first lead to said first wiring;
a second connecting means electrically connecting said second lead to said second wiring;
an impedance means formed in said semiconductor chip for electrically connecting said first wiring to said second wiring.

9. A semiconductor integrated circuit device according to claim 8, wherein said impedance means comprises a metal wiring formed integrally with said first wiring and said second wiring.

10. A semiconductor integrated circuit device according to claim 8, wherein said impedance means comprises metal wiring including an upper layer conductor formed contiguously with said first wiring for the input circuit and said second wiring for said other circuits, and a lower layer conductor comprising a refractory metal conductor connected to said upper layer by a plurality of through-holes or vias.

11. A semiconductor integrated circuit device according to claim 10, wherein said upper layer conductor is made of aluminum and said lower layer conductor of tungsten.

12. A semiconductor integrated circuit device according to claim 9, wherein said first wiring, second wiring and said metal wiring comprising said impedance means are formed of the same material in the same thickness, and the line width of said metal wiring comprising said impedance means is not more than one third of the width of said first wiring and second wiring.

13. A semiconductor integrated circuit device according to claim 12, wherein said metal wiring, first wiring and second wiring are comprised of aluminum.

14. A semiconductor integrated circuit device, comprising:
a semiconductor substrate;
a first lead to be connected to a first wiring for supplying a first potential to an input circuit formed on said semiconductor substrate;
a second lead to be connected to a second wiring for supplying said first potential to circuits formed on said semiconductor substrate other than said input circuit, wherein said second lead is physically isolated from said first lead;
a first connecting means electrically connecting said first lead to said first wiring;
a second connecting means electrically connecting said second lead to said second wiring; and
a resistance element formed on said semiconductor substrate for resistively connecting said first wiring to said second wiring, and wherein said first and said second lead each extends over said semiconductor substrate.

15. A semiconductor integrated circuit device according to claim 8, wherein said impedance means has a resistance value in a range of 10 to 100 ohms.

16. A semiconductor integrated circuit device according to claim 14, further comprising a third wiring for supplying a second potential which is different from said first potential to said input circuit and a capacitor interposed between said first wiring and said third wiring.

17. A semiconductor integrated circuit device according to claim 16, wherein said capacitor is a parasitic capacitor structured such that said first wiring for the input circuit and said second wiring for the input circuit are arranged adjacently to each other on said semiconductor substrate.

18. A semiconductor integrated circuit device according to claim 17, which is a dynamic RAM for performing the write/read operations by a plurality of bits at a time.

19. A semiconductor integrated circuit device comprising:
a semiconductor chip;
first and second lead frames to be connected to first power supply wirings for supplying first and second supply potentials, respectively, to an input circuit formed in said semiconductor chip, said first and second power supply potentials being different in level from each other;
third and fourth lead frames physically isolated from said first and second lead frames to be connected to second power supply wirings for supplying the first and second supply potentials, respectively, to circuits formed in said semiconductor chip other than said input circuit;
a first and a second impedance means formed on said semiconductor chip for connecting said first and said third lead frame and connecting said second and said fourth lead frame, respectively;
wherein each of said first, second, third and fourth lead frames includes an external terminal for supplying a respective one of said first and second supply potentials to a respective one of said input circuit and said other circuits.

20. A semiconductor integrated circuit device according to claim 19, wherein said first and second impedance means have a resistance value of from 10 ohms up to 100 ohms.

21. A semiconductor integrated circuit device according to claim 19, wherein said input circuit and said other circuit are arrayed along the length of the semiconductor chip, with said external terminals.

22. A semiconductor integrated circuit device, comprising:
a semiconductor substrate;
an input circuit and an output circuit formed on said semiconductor substrate;
a first lead to be connected to a first wiring for supplying a first potential to said input circuit and formed on said semiconductor substrate, and a second lead to be connected to a second wiring for supplying said first potential to said output circuit and formed on said semiconductor substrate;
a first bonding pad electrically connected to said first wiring and a second bonding pad electrically connected to said second wiring;
a first connecting means connecting said first lead to said first bonding pad, and a second connecting means connecting said second lead to said second bonding pad; and
an impedance means formed on said semiconductor substrate for electrically connecting said first wiring to said second wiring.

23. A semiconductor integrated circuit device according to claim 22, further comprising:
an internal circuit formed on said semiconductor substrate;
a third wiring for supplying said first potential to said internal circuit;
a third bonding pad electrically connected to said third wiring; and
a third connecting means connecting said third bonding pad to said second lead.

24. A semiconductor integrated circuit device according to claim 22, wherein said first lead and said second lead extend over said semiconductor substrate.

25. A semiconductor integrated circuit device according to claim 24, further comprising:
fourth bonding pads each connected to said second wiring;
a plurality of fourth connecting means electrically connecting said second lead to said fourth bonding pads.

26. A semiconductor integrated circuit device according to claim 14, further comprising a mold resin encapsulating said semiconductor substrate.

27. A semiconductor integrated circuit device according to claim 22, wherein said first and second wiring and said impedance comprise an aluminum layer, and wherein the width of said aluminum layer comprising said impedance means is not more than one third of the width of said aluminum layer comprising said first wiring and second wiring.

28. A semiconductor integrated circuit device according to claim 27, wherein said impedance means has a resistance value of from 10 ohms to 100 ohms.

29. A semiconductor integrated circuit device, comprising:
a semiconductor chip;
a first lead to be connected to a first wiring for supplying a first potential to an input circuit formed in said semiconductor chip;
a second lead physically isolated from said first lead and to be connected to a second wiring for supplying said first potential to circuits formed in said semiconductor chip other than the input circuit;
a first connecting means electrically connecting said first lead to said first wiring;
a second connecting means electrically connecting said second lead to said second wiring; and
a switching element formed in said semiconductor chip and connected between said first wiring and said second wiring.

30. A semiconductor integrated circuit device according to claim 29, wherein said switching element is a resistive element.

* * * * *